United States Patent [19]

Rybicki et al.

[11] Patent Number: 5,519,340
[45] Date of Patent: May 21, 1996

[54] LINE DRIVER HAVING MAXIMUM OUTPUT VOLTAGE CAPACITY

[75] Inventors: Mathew A. Rybicki; Joseph C. Y. Fong, both of Austin, Tex.

[73] Assignee: Motorola Inc., Schaumburg, Ill.

[21] Appl. No.: 332,668

[22] Filed: Nov. 1, 1994

[51] Int. Cl.[6] .............. H03K 19/0185; H03K 19/0948; H03K 19/003
[52] U.S. Cl. .................. 326/88; 326/86; 326/98; 326/15
[58] Field of Search .................. 326/83, 86–88, 326/119, 121, 21, 27, 30, 15, 17, 28, 93, 95, 98

[56] References Cited

U.S. PATENT DOCUMENTS

| 4,316,106 | 2/1982 | Young et al. | 326/88 |
| 4,649,300 | 3/1987 | Schutz | 326/88 |
| 4,806,798 | 2/1989 | Kanauchi | 326/83 |
| 5,128,563 | 7/1992 | Hush et al. | 326/86 |
| 5,138,200 | 8/1992 | Barsanti et al. | 326/88 |
| 5,399,920 | 3/1995 | Van Tran | 326/21 |

*Primary Examiner*—Edward P. Westin
*Assistant Examiner*—Jon Santamauro

[57] ABSTRACT

A line driver (10) includes a first p-channel FET (12) and two n-channel FETs (14–16), wherein one of the n-channel FETs functions as a blocking FET (16). The p-channel FET (12) is coupled to the supply voltage (26) and the blocking FET (16), while the other n-channel FET (14) is coupled to a supply return (28) and the blocking FET (16). An output (30) is provided between the n-channel FET (14) and the blocking FET (16), while inputs (20–22) are provided to the p-channel FET (12) and the n-channel FET (16). In operation, the inputs (20–22) are supplied to the FETs at a given rate such that either the p-channel or the n-channel FET is "on". To ensure a maximum output swing when the p-channel FET is on, the blocking FET (16) is sourced by a charge pump (18).

18 Claims, 5 Drawing Sheets

LINE DRIVER HAVING MAXIMUM OUTPUT VOLTAGE CAPACITY

TECHNICAL FIELD OF THE INVENTION

The present invention relates generally to integrated circuit line drivers and more particularly to integrated circuit line drivers having a maximum voltage output range.

BACKGROUND OF THE INVENTION

Electronic devices, such as telephone equipment and computer equipment, that transceive information via a wireline source include line drivers. Line drivers allow the electronic devices to source information on relatively low impedance wirelines, such as twisted pair copper wire. Typically, line drivers of the electronic devices are connected to a shared bus as shown in FIG. 4. As shown, a plurality of line drivers are coupled to a shared bus. Each of the line drivers, as shown in FIG. 1, includes a p-channel field effect transistor (FET) and an n-channel FET. The p-channel FET includes a gate node (G), a source node (S), a drain node (D), and an intrinsic diode. The n-channel FET also includes a gate node (G), a source node (S), a drain node (D), and an intrinsic diode.

Referring back to FIG. 4, any one of the plurality of line drivers may provide, at a given time, information on the shared bus. For example, if line driver 1 is providing a logic "1" to the share bus, the p-channel FET is "on", while the n-channel FET is "off", thus the shared bus will be pulled to the supply voltage ($V_{DD}$). Conversely, when line driver 1 is providing a logic "0", the n-channel FET is "on" while the p-channel FET is "off", thus the shared bus will be pulled to the return supply ($V_{SS}$). While line driver 1 is providing information on to the shared bus, the other line drivers will be inactivated until their turn to provide information on to the shared bus.

The sharing of the bus works well until one of the line drivers fail or has the supply voltage $V_{DD}$ removed. When this happens, the intrinsic diode of the P-channel FET will be forward biased whenever one of the other line drivers is attempting to pull up the shared bus. Thus, clamping the shared bus to a maximum voltage of approximately 0.7 volts (typical forward bias voltage of a diode). For example, assume that line driver 1 has $V_{DD}$ removed, or shorted to $V_{SS}$, the intrinsic diode of the p-channel FET will be forward biased when either line driver 2 or 3 attempts to provide a logic "1" on the shared bus.

FIGS. 2 and 3 each illustrate a line driver that prevents the above problem. FIG. 2 illustrates a two n-channel FET inverter. The top FET is driven by the inverse signal that drives the bottom FET. This embodiment prevents the above mentioned forward biasing of the p-channel's intrinsic diode when the supply voltage is shorted, or removed, however, it limits the output voltage swing from approximately $V_{SS}$ to approximately ($V_{DD}$-$V_{GS}$). The $V_{GS}$ term is introduced because the top n-channel FET must have a gate-source voltage ($V_{GS}$) in order for it to be "on", thus pulling the output up only to $V_{DD}$-$V_{GS}$.

FIG. 3 illustrates a three FET line driver that includes a P-channel FET coupled in series with two n-channel transistors. When $V_{DD}$ is removed, or shorted to ground, an intrinsic diode of the second n-channel FET prevents the intrinsic diode of p-channel FET from being forward biased. As with the solution of FIG. 2, this embodiment limits its output voltage swing from approximately $V_{SS}$ to approximately ($V_{DD}$-$V_{GS}$) for the same reason.

In many applications, the less than maximum voltage swing produced by the solutions shown in FIG. 2 and FIG. 3 is not of great concern when supply voltages are relatively high, i.e., greater than 5 volts. As supply voltages are being reduced to meet the demand for reduced power consumption, limiting the output swing of line drivers is becoming of greater importance. For example, if the supply voltage $V_{DD}$ is 3 volts, a 1 volt $V_{GS}$ drop limits the maximum output voltage to 2 volts, which may be insufficient in many circuits to represent a logic "1". Therefore, a need exists for a line driver which provides a maximum output voltage swing while preventing reverse biasing of intrinsic diodes under failure mode, power removal, conditions.

DETAILED DESCRIPTION OF A PREFERRED EMBODIMENT

Generally, the present invention provides a line driver that eliminates the forward biasing of intrinsic diodes while providing maximum output voltage swing. This is accomplished by providing three, or four, serially connected field effect transistors (FET) and a charge pump. For the three transistor line driver, the first transistor is a p-channel FET, while the other two transistors are n-channel FETs, wherein one of the n-channel FETs functions as a blocking FET. The p-channel FET is coupled to the supply voltage and the blocking FET, while the other n-channel FET is coupled to a supply return and the blocking FET. An output is provided between the n-channel FET and the blocking FET, while inputs are provided to the p-channel FET and the n-channel FET. In operation, the inputs are supplied to the FETs at a given rate such that either the p-channel or the n-channel FET is "on". To ensure a maximum output swing when the p-channel FET is on, the blocking FET is sourced by the charge pump such that the $V_{GS}$ limitation of prior art line drivers is eliminated. This is eliminated because the charge pump provides an input voltage to the gate of the blocking diode of about ($V_{DD}$+$V_{GS}$), thereby allowing the voltage at the source of the blocking FET to be pulled up to essentially $V_{DD}$.

Figure 5:
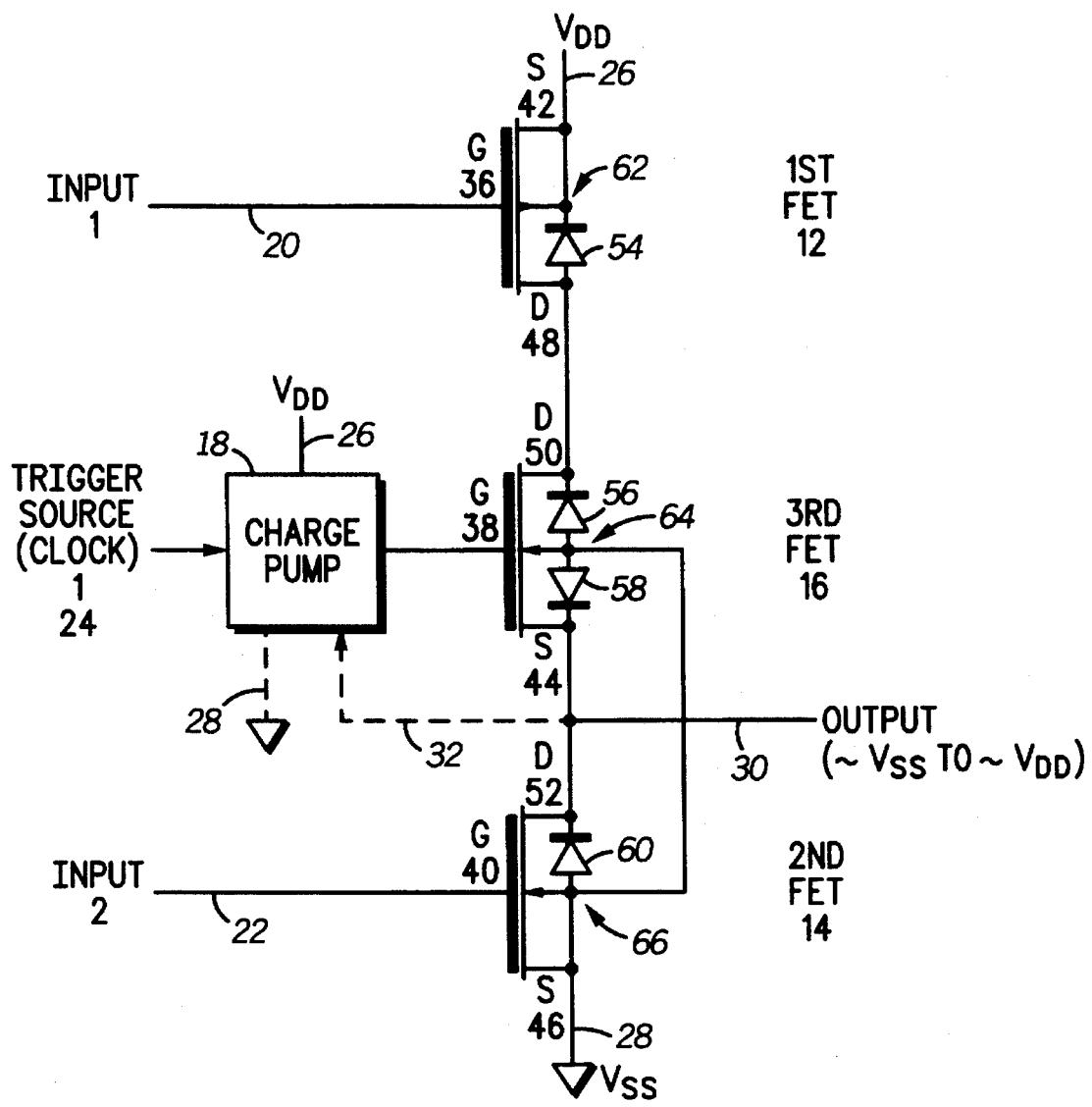
FIG. 5 illustrates a line driver in accordance with the present invention.

FIG. 5 illustrates a line driver 10 that includes a first field effect transistor (FET) 12, a second FET 14, a third FET 16, and a charge pump 18. Each FET 12–16 includes a gate 36–40, a source 42–46, a drain 48–52, intrinsic diodes 54–60, and a substrate connection 62–66. Due to the manufacturing process of field effect transistors two intrinsic diodes are formed on each FET: one between the source and the substrate connection and the other between the drain and substrate connection. As shown, first FET 12 is a p-channel FET having substrate connection 62 coupled to source 42, which shorts out one of the intrinsic diodes. The other intrinsic diode 54 has its anode coupled to drain 48 and its cathode coupled to substrate connection 62. Second and third FETs 14–16 are no channel FETs, each having substrate connection 64–66 coupled to the second potential 28. Due to the substrate coupling, one of the intrinsic diodes of second FET 14 is shorted, while third FET 16 has neither intrinsic diodes 56–58 shorted.

In operation, line driver 10 receives a first input 20 and a second input 22 into gate 36 of first FET 12 and gate 40 of second FET 14, respectively. In practice, input 20 and input 22 may be the same signals or different signals, however, for the purpose of this discussion, they will be described as being the same signal. When the first and second inputs 20 and 22 are equivalent to a logic "1", i.e., approximately equal to the first potential $V_{DD}$ 26, the first FET 12 is "off" while second FET 14 is "on", thus output 30 is pulled to a logic "0", i.e., substantially equal to the second potential $V_{SS}$ 28. Third FET 16 will be "off" during this time due to first FET 12 being "off". Note that output 30 equals second potential 28, which is approximately 0 volts, plus any voltage drop across second FET 14 due to the ON resistance of second FET 14 and current being sinked.

When first input 20 and second input 22 are equivalent to a logic "0", i.e., approximately equal to the second potential $V_{SS}$ 28, second FET 14 is "off" while first FET 12 and third FET 16 are "on". With first FET 12 being "on" its drain 48 is pulled to first potential $V_{DD}$ 26, which may be in the range of 2.0 volts to 10 volts, less any voltage drop due to the ON resistance of first FET 12 and current being supplied. Third FET 16 is enabled when charge pump 18 provides a signal to gate 38 of third FET 16. The signal produced by charge pump 18 may be triggered by output 30 via path 32 or a trigger source 24, such as a clock. Note that when charge pump 18 is being triggered by trigger source 24 which has a frequency equivalent to that of inputs 20 and 22, charge pump 18 is coupled to second potential 28; when charge pump 18 is being triggered by output 30, charge pump 18 is coupled to first potential 26. In practice, charge pump 18 may comprise a capacitor that is charged, during one phase of the trigger, to a voltage equal to or greater than the threshold voltage $V_{GS}$ to turn on third FET 16. During the next phase of the trigger, the voltage imposed across the capacitor is stacked, or added to, the trigger such that the voltage applied to gate 38 of third FET 16 is the trigger voltage plus the capacitor voltage. Note that the trigger voltage is approximately equal to first potential $V_{DD}$ 26.

Figure 1:
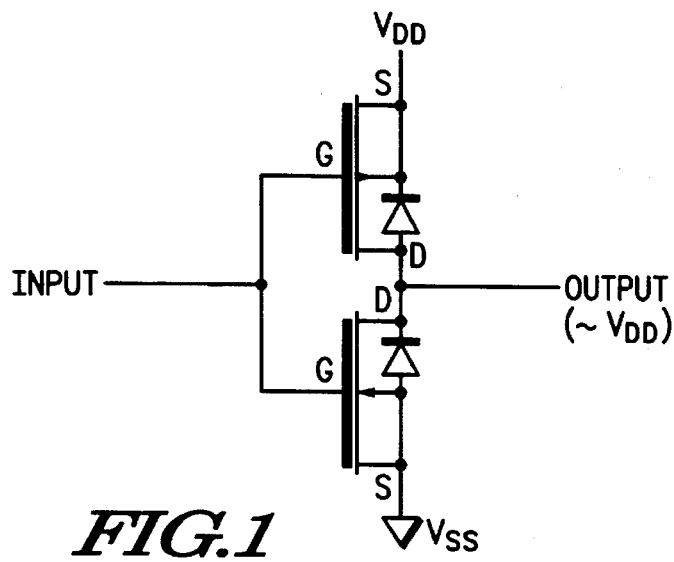
FIG. 1 illustrates a prior art implementation for a line driver.
Figure 2:
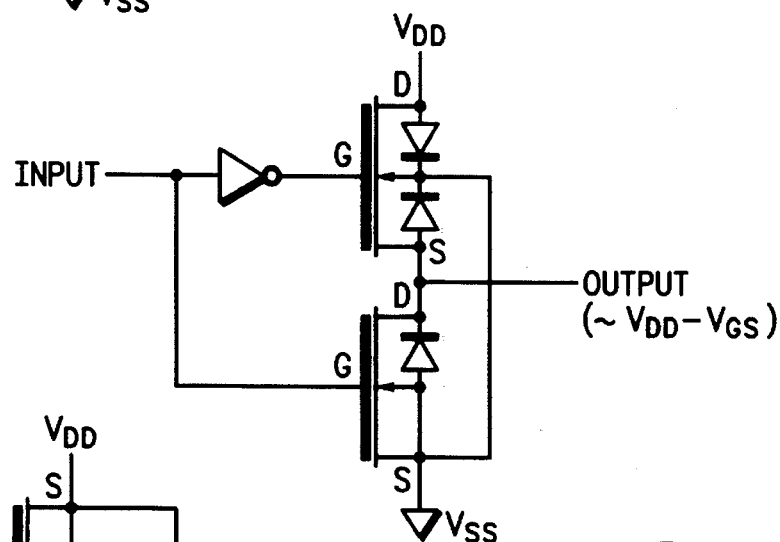
FIG. 2 illustrates an alternate prior art embodiment of a line driver.
Figure 3:
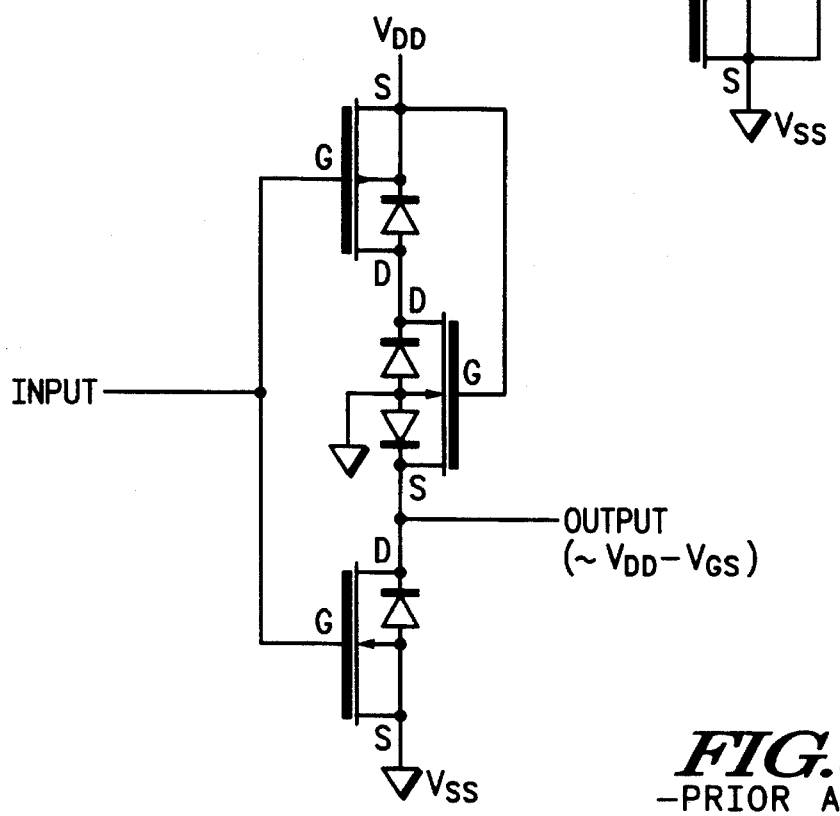
FIG. 3 illustrates yet another alternate embodiment of a prior art line driver.
Figure 4:
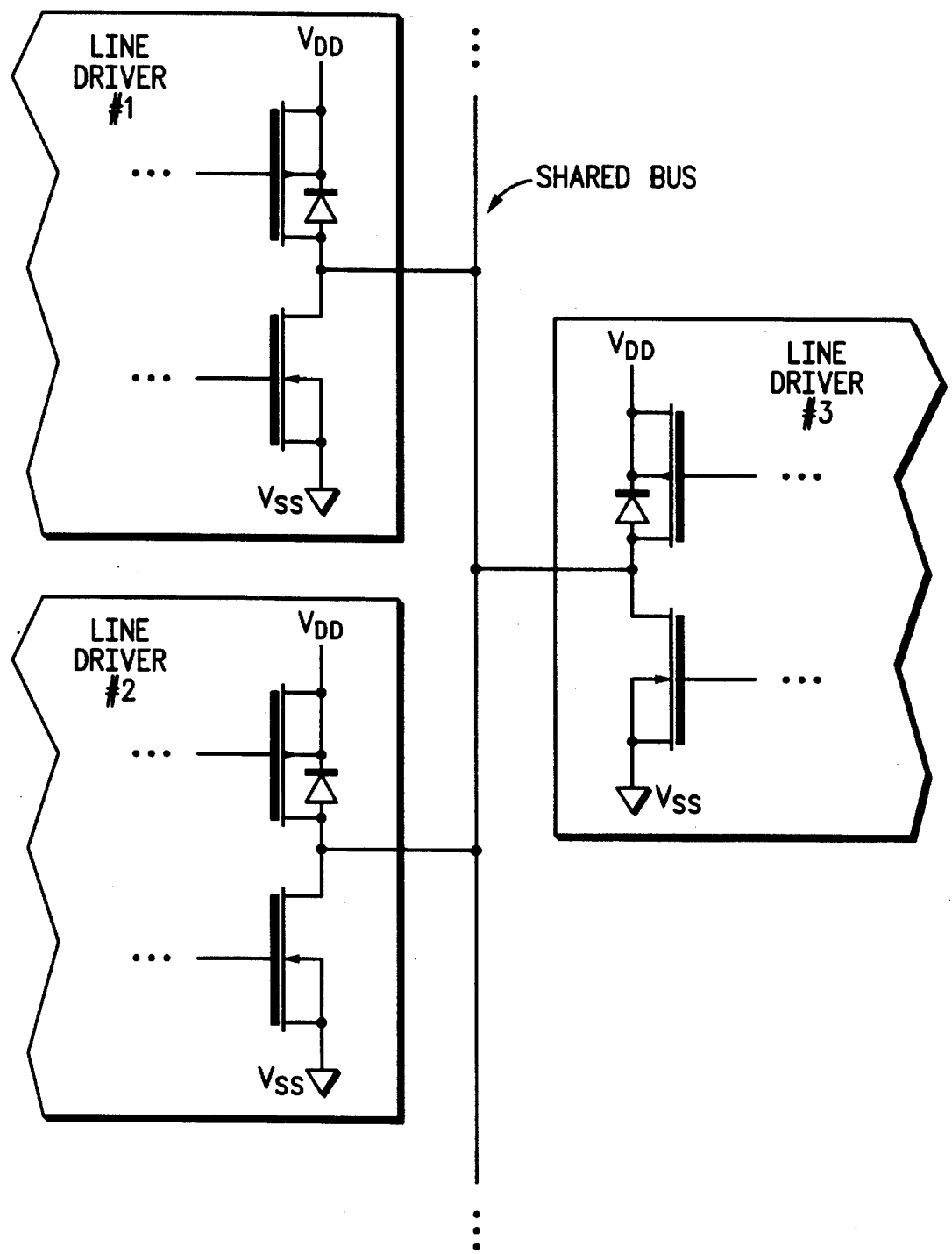
FIG. 4 illustrates a shared bus architecture of the prior art.

With the voltage being applied to gate 38 of third FET 16 being ($V_{DD}+V_{GS}$), third FET 16 is completely turned "on" such that source 44 of third FET 16 is pulled to approximately first potential $V_{DD}$ 26 less any voltage drops due the ON resistance of third FET 16 and current being sourced. Thus, output 30 varies from essentially first potential $V_{DD}$ 26 to second potential $V_{SS}$ 28 based on inputs 20–22. Recall, that in the prior art line drivers shown in FIG. 2 and FIG. 3, the output was restricted to $V_{DD}-V_{GS}$ in order for the n-channel FET to be "on", which, for low voltage applications, i.e., less than 3 volts, is unacceptable. Therefore, line driver 10 eliminates this limitation and is thus a useful circuit for low voltage applications.

Line driver 10 also prevents intrinsic diode 54 of first FET 12 from conducting when first potential $V_{DD}$ 26 is removed or shorted to $V_{SS}$ 28 and output 30 is high, i.e., at first potential $V_{DD}$ 26. Intrinsic diode 54 is prevented from conducting, thus clamping output 30 to VSS plus a diode drop, by intrinsic diode 58 of the third FET 16. When $V_{DD}$ 26 is low and output 30 is high, intrinsic diode 58 is reverse biased thus preventing current from flowing to forward biased intrinsic diode 54.

Figure 6:
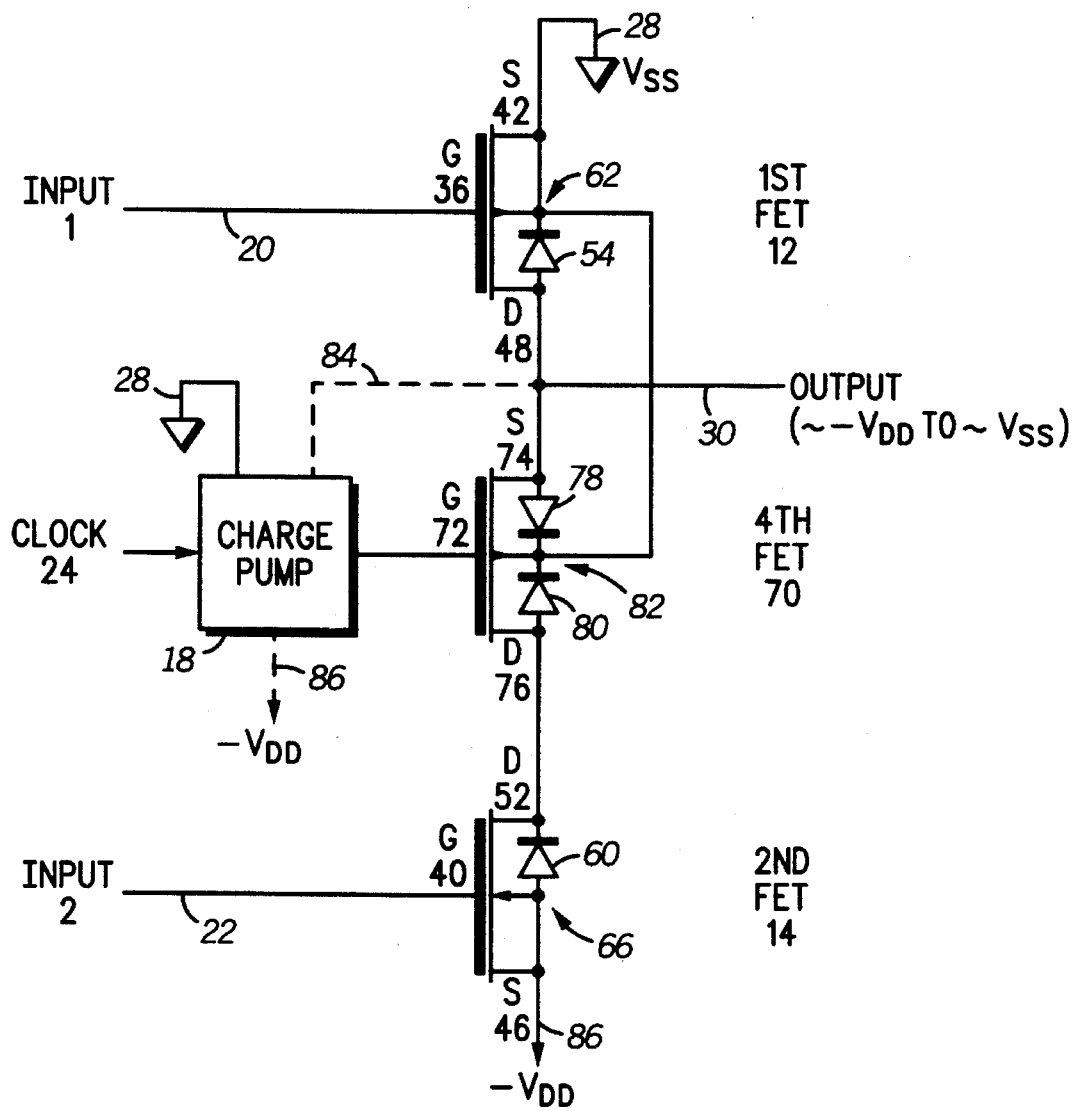
FIG. 6 illustrates a line driver which is in accordance with an alternate embodiment of the present invention.

FIG. 6 illustrates a line driver 81 which implements an alternative embodiment of the present invention. Line driver 81 comprises 3 FETs 12, 14, 70 and charge pump 18. Line driver 81 operates in a very similar manner as line driver 10 of FIG. 5, except first potential is $V_{SS}$ 28 and second potential is $-V_{DD}$ 86. When inputs 20–22 are low, i.e., approximately equal to $-V_{DD}$, first FET 12 is "on", while second FET 14 and fourth FET 70 are "off", such that output 30 is pulled to approximately $V_{SS}$ 26 less voltage drops due to on resistances of first FET 12. When inputs 20–22 are high, i.e., approximately equal to $V_{SS}$ 28, second FET 14 and fourth FET 70 are "on" while first FET 12 is "off", thus output 30 is pulled low to approximately $-V_{DD}$ 86 less voltage drops due to on resistance of second FET 14 and fourth FET 70.

As with the line driver 10 of FIG. 5, line driver 81 has charge pump 18 coupled to fourth FET 70, wherein fourth FET 70 is a p-channel FET and includes intrinsic diodes 78–80 and substrate connection 82. Charge pump 18 may be triggered by clock 24 or output 30 and adds a $V_{GS}$ voltage to a signal provided to gate 72 of fourth FET 70, such that source 74 may be pulled to $-V_{DD}$ 86, when fourth FET 70 is "on". When clock 24 is functioning as the trigger source, charge pump 18 is coupled to first potential $V_{SS}$ 28. When output 30 is functioning as the triggering source, charge pump 18 is coupled to $-V_{DD}$ 86. Note that drain 76 of fourth FET 70 is coupled to second FET 14.

When $-V_{DD}$ 86 is removed or shorted to $V_{SS}$ 28, intrinsic diode 78 of fourth FET 70 blocks the intrinsic diode 60 of second FET 14 and intrinsic diode 80 of fourth FET 70 from being forward biased when the output 30 is pulled to a negative voltage. Thus, line driver 81 provides the same advantages as line driver 10, wherein line driver 81 is designed for negative supply voltages. These advantages being a full voltage swing on output 30, while preventing output 30 from being clamped due to a forward biased intrinsic diode when the supply is removed and output 30 is pulled towards the supply.

Figure 7:
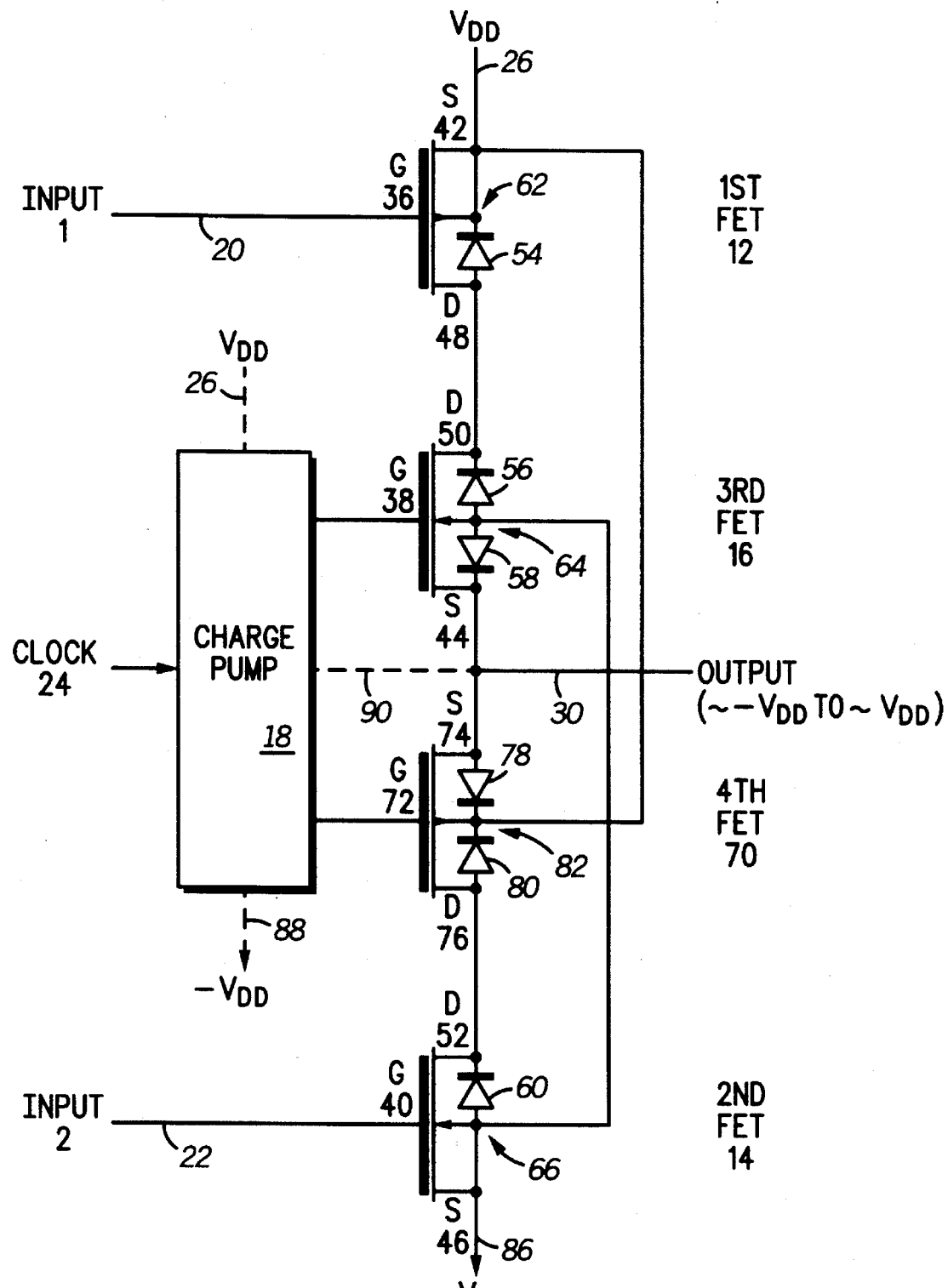
FIG. 7 illustrates a line driver in accordance with yet another embodiment of the present invention.

FIG. 7 illustrates a line driver 100 which is yet another embodiment of the present invention. In this embodiment, first potential is $V_{DD}$ 26, while the second potential is $-V_{DD}$ 86. Thus, line driver 100 is designed to operate over a voltage range of +/−3 volts to +/−10 volts (i.e., a split supply operation). When first input 20 and second input 22 are high, (approximately equal to $V_{DD}$ 26) first FET 12 and third FET 16 are both "off", while fourth FET 70 and second FET 14 are "on" such that output 30 is pulled to approximately $-V_{DD}$ 86. Conversely, when first input 20 and second input 22 are low, (approximately equal to $-V_{DD}$ 86) fourth FET 70 and second FET 14 are "off", while first FET 12 and third FET 16 are "on" such that output 30 is pulled to approximately $V_{DD}$ 26. As with the previously described line drivers 10 and 81, when the supply is removed, intrinsic diode 58 of third FET 16 and intrinsic diode 78 of fourth FET 70 prevent intrinsic diode 60 of second FET 14 and intrinsic diode 54 of first FET 12 from conducting when the output 30 is pulled either positively or negatively. Thus, line driver 100 provides a split supply operating line driver that allows output 30 to swing from approximately the minus voltage supply, or second potential, to approximately the positive rail, or first potential, less any voltage drops due to the on-resistance of the FETs.

The present invention provides a series of line driver embodiments that prevent reverse biasing of intrinsic diodes such that a shared bus will not be clamped when a line driver fails or is turned off. In addition, the line drivers provide a maximum output swing such that minimal supply voltages may be used without losing information as often occurred with prior art line drivers.

We claim:

1. A line driver comprising:

a first field effect transistor having a first gate node, a first source node, a first drain node and a first intrinsic diode having a first cathode node and a first anode node, wherein the first cathode node is operably coupled to the first source node, wherein the first anode node is coupled to the first drain node, wherein the first source node is coupled to a first potential, and wherein the first gate node provides a first input;

a second field effect transistor having a second gate node, a second source node, a second drain node and a second intrinsic diode having a second cathode node and a second anode node, wherein the second cathode node is coupled to the second drain node, wherein the second anode node is operably coupled to the second source node, wherein the second source node is coupled to a second potential, wherein the first potential is greater than the second potential, and wherein the second gate provides a second input;

a charge pump circuit operably coupled to a triggering source, wherein the charge pump circuit produces a continuous output gating signal in response to the triggering source, the continuous output gating signal being substantially constant relative to the first potential, and the triggering source being independent of either of the first or second inputs; and a third field effect transistor having a third gate node, a third source node, a third drain node and a third intrinsic diode having a third cathode node and a third anode node, wherein the third cathode node is coupled to the third source node, wherein the third anode node is operably coupled to the second potential, wherein the third drain node is coupled to the first drain node, wherein the third gate node is coupled to the charge pump circuit to receive the continuous output gating signal, and wherein the third source node is coupled to the second drain node to provide an output that ranges from approximately the first potential to the second potential.

2. The line driver of claim 1, wherein the continuous output gating signal is a higher potential than the first potential.

3. The line driver of claim 1, wherein the triggering source comprises a clock signal provided by a clock.

4. The line driver of claim 1, wherein the charge pump circuit further comprises operable coupling to the first potential.

5. The line driver of claim 1, wherein the charge pump circuit further comprises operably coupling to the second potential.

6. The line driver of claim 1 further comprises a substrate wherein the first field effect transistor, the second field effect transistor, the third field effect transistor, and the charge pump circuit are deposited on the substrate to produce at least a portion of an integrated circuit.

7. A line driver comprising:

a first field effect transistor having a first gate node, a first source node, a first drain node and a first intrinsic diode having a first cathode node and a first anode node, wherein the first cathode node is operably coupled to the first source node, wherein the first anode node is coupled to the first drain node, wherein the first source node is coupled to a first potential, and wherein the first gate node provides a first input;

a second field effect transistor having a second gate node, a second source node, a second drain node and a second intrinsic diode having a second cathode node and a second anode node, wherein the second cathode node is coupled to the second drain node, wherein the second anode node is operably coupled to the second source node, wherein the second source node is coupled to a second potential, wherein the first potential is greater than the second potential, and wherein the second gate provides a second input;

a charge pump circuit operably coupled to a triggering source, wherein the charge pump circuit produces a continuous output gating signal in response to the triggering source, the continuous output gating signal being substantially constant relative to the second potential, and the triggering source being independent of either of the first or second inputs; and a third field effect transistor having a third gate node, a third source node, a third drain node and a third intrinsic diode having a third cathode node and a third anode node, wherein the third cathode node is operably coupled to the first potential, wherein the third anode node is operably coupled to the third source node, wherein the third drain node is coupled to the second drain node, wherein the third gate node is coupled to the charge pump circuit to receive the continuous output gating signal, and wherein the third source node is coupled to the first drain node to provide an output that ranges from approximately the first potential to the second potential.

8. The line driver of claim 7, wherein the continuous output gating signal is a lower potential than the second potential.

9. The line driver of claim 7, wherein the triggering source comprises a clock signal provided by a clock.

10. The line driver of claim 7, wherein the charge pump circuit further comprises operable coupling to the first potential.

11. The line driver of claim 7, wherein the charge pump circuit further comprises operably coupling to the second potential.

12. The line driver of claim 7 further comprises a substrate wherein the first field effect transistor, the second field effect transistor, the third field effect transistor, and the charge pump circuit are deposited on the substrate to produce at least a portion of an integrated circuit.

13. A line driver comprising:

a first field effect transistor having a first gate node, a first source node, a first drain node and a first intrinsic diode having a first cathode node and a first anode node, wherein the first cathode node is operably coupled to the first source node, wherein the first anode node is coupled to the first drain node, wherein the first source node is coupled to a first potential, and wherein the first gate node provides a first input;

a second field effect transistor having a second gate node, a second source node, a second drain node and a second intrinsic diode having a second cathode node and a second anode node, wherein the second cathode node is coupled to the second drain node, wherein the second anode node is operably coupled to the second source node, wherein the second source node is coupled to a second potential, wherein the first potential is greater than the second potential, and wherein the second gate node provides a second input;

a charge pump circuit operably coupled to a triggering source, wherein the charge pump circuit produces a first continuous output gating signal and a second continuous output gating signal, the first continuous output gating signal being substantially constant relative to the first potential, and the second continuous output gating signal being substantially constant relative to the second potential, the triggering source being independent of either of the first or second inputs;

a third field effect transistor having a third gate node, a third source node, a third drain node and a third intrinsic diode having a third cathode node and a third anode node, wherein the third cathode node is coupled to the third source node, wherein the third anode node is operably coupled to the second potential, wherein the third drain node is coupled to the first drain node, wherein the third gate node is coupled to the charge pump circuit to receive the first continuous output gating signal; and a fourth field effect transistor having a fourth gate node, a fourth source node, a fourth drain node and a fourth intrinsic diode having a fourth cathode node and a fourth anode node, wherein the fourth cathode node is operably coupled to the first potential, wherein the fourth anode node is operably coupled to the fourth source node, wherein the fourth drain node is coupled to the second drain node, wherein the fourth gate node is coupled to the charge pump circuit to receive the second continuous output gating signal, and wherein the fourth source node is coupled to the third source node to provide an output that ranges from approximately the first potential to the second potential.

14. The line driver of claim 13, wherein the first continuous output gating signal is a higher potential than the first potential and the second continuous output gating signal is a lower potential than the second potential.

15. The line driver of claim 13, wherein the triggering source comprises a clock signal provided by a clock.

16. The line driver of claim 13, wherein the charge pump circuit further comprises operable coupling to the first potential.

17. The line driver of claim 13, wherein the charge pump circuit further comprises operably coupling to the second potential.

18. The line driver of claim 13 further comprises a substrate wherein the first field effect transistor, the second field effect transistor, the third field effect transistor, and the charge pump circuit are deposited on the substrate to produce at least a portion of an integrated circuit.

* * * * *